(12) United States Patent
Park (10) Patent No.: US 12,219,815 B2
(45) Date of Patent: Feb. 4, 2025

(54) DISPLAY DEVICE

(71) Applicant: LG Display Co., Ltd., Seoul (KR)

(72) Inventor: JaeHoon Park, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 506 days.

(21) Appl. No.: 17/507,440

(22) Filed: Oct. 21, 2021

(65) Prior Publication Data

US 2022/0208920 A1 Jun. 30, 2022

(30) Foreign Application Priority Data

Dec. 31, 2020 (KR) .......................... 10-2020-0189238

(51) Int. Cl.
*H01L 27/14* (2006.01)
*H10K 59/121* (2023.01)
*H01L 27/12* (2006.01)
*H01L 29/786* (2006.01)

(52) U.S. Cl.
CPC ..... *H10K 59/1216* (2023.02); *H10K 59/1213* (2023.02); *H01L 27/1225* (2013.01); *H01L 27/1255* (2013.01); *H01L 29/7869* (2013.01)

(58) Field of Classification Search
CPC .......... H10K 59/1216; H10K 59/1213; H10K 59/126; H10K 59/12; H10K 59/131; H10K 59/35; H01L 27/1225; H01L 27/1255; H01L 29/7869; H01L 27/124
USPC ...................................................... 257/59, 72
See application file for complete search history.

(56) References Cited

U.S. PATENT DOCUMENTS

| 10,529,787 | B2 * | 1/2020 | Oh ........................ G09G 3/3233 |
| 10,608,068 | B2 * | 3/2020 | Liu ........................... H10K 59/38 |
| 10,672,339 | B2 * | 6/2020 | Beak ..................... H10K 50/805 |
| 2018/0175077 | A1 | 6/2018 | Koo et al. |
| 2020/0144309 | A1 * | 5/2020 | Jeon ..................... H01L 27/1255 |

FOREIGN PATENT DOCUMENTS

| KR | 10-2018-0068634 A | 6/2018 |
| KR | 10-2018-0070334 A | 6/2018 |
| KR | 10-2019-0128801 A | 11/2019 |
| KR | 10-2020-0052782 A | 5/2020 |

* cited by examiner

*Primary Examiner* — Tan N Tran
(74) *Attorney, Agent, or Firm* — Birch, Stewart, Kolasch & Birch, LLP (57) ABSTRACT

A display device can include a plurality of sub-pixels disposed on a substrate; a storage capacitor disposed in each of the plurality of sub-pixels; a buffer layer disposed on the storage capacitor; a transistor disposed on the buffer layer in each of the plurality of sub-pixels; and a light emitting element disposed on the transistor in each the plurality of sub-pixels, in which the plurality of sub-pixels include a first sub-pixel, a second sub-pixel, and a third sub-pixel, each of the first, second and third sub-pixels being configured to emit a different color of light, at least one of the plurality of sub-pixels includes a metal layer disposed below the transistor, and the metal layer is connected to one electrode of the storage capacitor.

19 Claims, 6 Drawing Sheets

DISPLAY DEVICE

CROSS-REFERENCE TO RELATED APPLICATIONS

This application claims priority to Korean Patent Application No. 10-2020-0189238 filed on Dec. 31, 2020, in the Republic of Korea, the entire contents of which are hereby expressly incorporated by reference into the present application.

BACKGROUND

Technical Field

The present disclosure relates to a display device, and more particularly, to a display device capable of improving quality by applying an S-factor optimized for each sub-pixel.

Discussion of the Related Art

Recently, as our society advances toward an information-oriented society, the field of display devices for visually expressing an electrical information signal has rapidly advanced. Various display devices having excellent performance in terms of thinness, lightness, and low power consumption, are being developed correspondingly.

Specific examples of such a display device include a liquid crystal display (LCD), and electroluminescent display devices such as an organic light emitting display (OLED) and a quantum dot light emitting display (QLED). In particular, the electroluminescent display device is a next-generation display device having self-luminous properties (e.g., a separate backlight unit is not needed), and has superior characteristics in terms of a viewing angle, contrast, a response speed, power consumption, and the like, compared to the liquid crystal display.

The electroluminescent display device includes a display area for displaying an image and a non-display area disposed adjacent to the display area. In addition, a pixel area includes a pixel circuit and light emitting elements. A plurality of thin film transistors are positioned in the pixel circuit to drive the light emitting elements disposed in a plurality of pixels.

However, individual light emitting elements for displaying different colors may have different operating characteristics for a given gray scale value, and these differences can lead to a mura defect (e.g., unevenness, irregularities or blemishes) for certain gray scale values (e.g., such as when operating in a low gray scale range).

SUMMARY OF THE DISCLOSURE

An S-factor of a transistor may be adjusted by disposing a metal layer overlapping an active layer below the active layer of the transistor. In this situation, the S-factor may increase as a distance between the active layer and the metal layer decreases. On the other hand, when the distance between the active layer and the metal layer increases or the metal layer does not exist below the active layer, the S-factor may decrease. As the S-factor increases, a range of data voltages for expressing gray scale may increase. On the other hand, as the S-factor decreases, the range of data voltages for expressing gray scale may decrease.

The inventors of the present disclosure have recognized that the range of data voltages for expressing gray scale varies according to efficiency of light emitting elements disposed in sub-pixels. In particular, it has been recognized that in the situation of a blue sub-pixel having relatively low efficiency, a wider range of data voltages is available than compared with than those of a red sub-pixel and a green sub-pixel.

In addition, the inventors of the present disclosure have recognized that when the same S-factor is applied to the plurality of sub-pixels, a defect may occur in a specific sub-pixel. For example, when a high S-factor is applied to all of the sub-pixels, ranges of data voltages of the red sub-pixel and the green sub-pixel for expressing gray scale may satisfy a voltage specification of a data driver, but the blue sub-pixel may be out of the voltage specification of the data driver because the range of data voltages of the blue sub-pixel is excessively wide (e.g., thus, some gray scale values may not be supported or properly expressed by the blue sub-pixel). In this situation, peak luminance in the blue sub-pixel may not be achieved. In addition, when a low S-factor is applied to the plurality of sub-pixels, the blue sub-pixel may have an appropriate range of data voltages that satisfies the voltage specification of the data driver, but the ranges of data voltages of the red sub-pixel and the green sub-pixel are excessively narrower, causing mura at low gray scale (e.g., unevenness, irregularities or blemishes).

In order to solve this defect, the inventors of the present disclosure have invented a display device to which an optimized S-factor can be applied by applying a different structure for each sub-pixel.

An aspect of the present disclosure is to reduce mura at low gray scale by applying a high S-factor to a first sub-pixel and a second sub-pixel and a low S-factor to a third sub-pixel.

Another aspect of the present disclosure is to easily adjust gray scales of the sub-pixels by allowing the plurality of sub-pixels to utilize a range that best corresponds to a specification voltage of a data driver as much as possible when expressing gray scale.

Objects of the present disclosure are not limited to the above-mentioned objects, and other objects, which are not mentioned above, can be clearly understood by those skilled in the art from the following descriptions.

According to an aspect of the present disclosure, a display device includes a substrate including a plurality of sub-pixels; a storage capacitor in the plurality of sub-pixels on the substrate; a buffer layer on the storage capacitor; a transistor in the plurality of sub-pixels on the buffer layer; and a light emitting element on the transistor. The plurality of sub-pixels include a first sub-pixel, a second sub-pixel, and a third sub-pixel that emit light of different colors. At least one of the plurality of sub-pixels includes a metal layer disposed below the transistor. The metal layer is connected to one of electrodes of the storage capacitor.

According to another aspect of the present disclosure, a display device includes a substrate including a plurality of sub-pixels; a first capacitor electrode at each of the plurality of sub-pixels; an interlayer insulating layer on the first capacitor electrode; a second capacitor electrode on the interlayer insulating layer to overlap the first capacitor electrode; a buffer layer on the second capacitor electrode; a transistor on the buffer layer and including an active layer; and a light emitting element on the transistor. The plurality of sub-pixels include a first sub-pixel, a second sub-pixel, and a third sub-pixel that emit light of different colors. In the first sub-pixel and the second sub-pixel, the second capacitor electrode is configured to extend from an area overlapping the first capacitor electrode to an area overlapping the active layer.

According to yet another aspect of the present disclosure, a display device includes a substrate including a display area having a plurality of sub-pixels and a non-display area surrounding the display area; a storage capacitor in the plurality of sub-pixels on the substrate; a buffer layer on the storage capacitor; a transistor in the plurality of sub-pixels on the buffer layer; a light emitting element on the transistor of the display area, and a metal layer disposed below the transistor. The plurality of sub-pixels include a first sub-pixel, a second sub-pixel, and a third sub-pixel that emit light of different colors. The metal layer is disposed in each of the first sub-pixel, the second sub-pixel, and the third sub-pixel. The metal layer in the first sub-pixel and the second sub-pixel and the metal layer in the third sub-pixel are disposed on different layers.

Other detailed matters of the example embodiments are included in the detailed description and the drawings.

According to the present disclosure, the blue sub-pixel has a low S-factor, thereby securing an appropriate range of data voltages when expressing gray scale.

According to the present disclosure, the red sub-pixel and the green sub-pixel have a high S-factor, for improving mura at low gray scale while securing an appropriate range of data voltages, when expressing gray scale.

The effects according to the present disclosure are not limited to the contents exemplified above, and more various effects are included in the present specification.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "over," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components and may not define order. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings. All the components of each display device according to all embodiments of the present disclosure are operatively coupled and configured.

Figure 1:
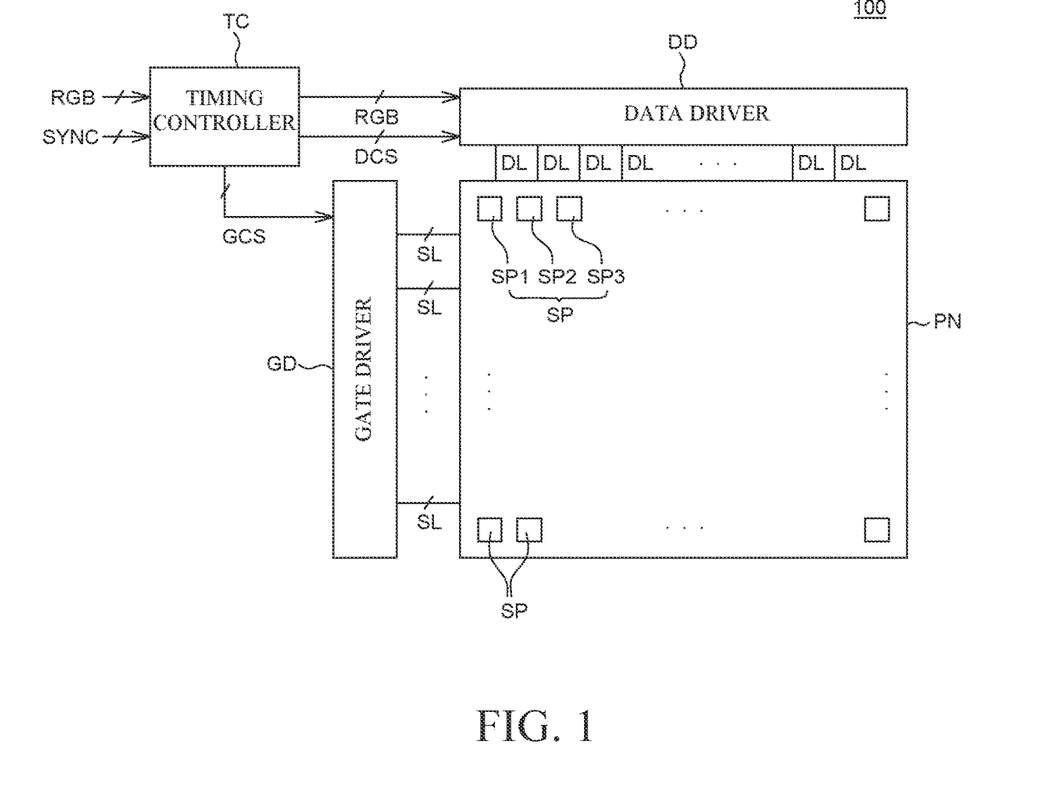
FIG. 1 is a schematic configuration diagram of a display device according to an embodiment of the present disclosure.

FIG. 1 is a schematic configuration diagram of a display device according to an example embodiment of the present disclosure. In FIG. 1, only a display panel PN, a gate driver GD, a data driver DD, and a timing controller TC among various components of a display device 100 are illustrated for convenience of explanation.

Referring to FIG. 1, the display device 100 includes the display panel PN including a plurality of sub-pixels SP, and the gate driver GD and the data driver DD for supplying various signals to the display panel PN, and the timing controller TC for controlling the gate driver GD and the data driver DD.

The gate driver GD supplies a plurality of scan signals to a plurality of scan lines SL according to a plurality of gate control signals GCS provided from the timing controller TC. Although it is illustrated in FIG. 1 that the gate driver GD is disposed to be spaced apart from one side of the display panel PN, the gate driver GD can be practically disposed in the display panel PN in a gate in panel (GIP) manner. That is, the gate driver GD can be disposed in a non-display area adjacent to a display area of the display panel PN. Also, although one gate driver GD is illustrated in FIG. 1, the number of gate drivers GD is not limited thereto.

The data driver DD converts image data RGB input from the timing controller TC into a data signal using a reference gamma voltage according to a plurality of data control signals DCS provided from the timing controller TC. In addition, the data driver DD can supply the converted data signal to a plurality of data lines DL. Although one data driver DD is illustrated as being spaced apart from an upper side of the display panel PN in FIG. 1, the number and arrangement of the data drivers DD are not limited thereto.

The timing controller TC aligns image data RGB input from the outside and supplies it to the data driver DD. The timing controller TC can generate the gate control signal GCS and the data control signal DCS using a synchronization signal SYNC input from the outside, for example, a dot clock signal, a data enable signal, and a horizontal/vertical synchronization signal. In addition, the timing controller TC can supply the generated gate control signal GCS and data control signal DCS to the gate driver GD and the data driver DD, respectively, to thereby control the gate driver GD and the data driver DD.

The display panel PN includes a display area and a non-display area. In this situation, the display area and the non-display area can be areas that are defined on a substrate 110 of the display panel PN, which will be described later. The display area can be an area including the plurality of sub-pixels SP to display an image. The non-display area can be an area surrounding the display area and displaying no image. The gate driver GD and the data driver DD can be disposed in the non-display area.

The display area is an area for displaying an image. The plurality of sub-pixels SP for displaying an image and a driving circuit for driving the plurality of sub-pixels SP can be disposed in the display area. The plurality of scan lines SL and the plurality of data lines DL cross each other in the display area of the display panel PN, and each of the plurality of sub-pixels SP is connected to the scan line SL and the data line DL.

Each of the plurality of sub-pixels SP is an individual unit emitting light, and a light emitting element 140 can be disposed in each of the plurality of sub-pixels SP. The plurality of sub-pixels SP can include a first sub-pixel SP1 that is a red sub-pixel, a second sub-pixel SP2 that is a green sub-pixel, and a third sub-pixel SP3 that is a blue sub-pixel. A plurality of light emitting elements 140 can be defined differently depending on a type of the display panel PN. For example, when the display panel PN is an organic light emitting display panel, the light emitting element can be an organic light emitting element including an anode, an organic layer, and a cathode. In addition, a quantum dot light-emitting diode (QLED) including a quantum dot (QD) can be further used as the light emitting element. Hereinafter, it is assumed that the light emitting element 140 is an organic light emitting element, but a type of the light emitting element is not limited thereto.

The driving circuit can include various transistors 130a and 130b, storage capacitors 120a and 120b, and wirings for driving the plurality of sub-pixels SP. For example, the driving circuit can include various components such as a driving transistor, a switching transistor, a sensing transistor, a storage capacitor, a gate line GL, and a data line DL, but is not limited thereto.

The non-display area is an area where an image is not displayed and is disposed to surround the display area. The non-display area is an area in which various wirings, driver ICs, and the like for driving the plurality of sub-pixels SP disposed in the display area are disposed. For example, various driver ICs such as the gate driver GD and the data driver DD can be disposed in the non-display area.

Hereinafter, the sub-pixels SP1, SP2, and SP3 of the display device 100 according to an example embodiment of the present disclosure will be described in more detail with reference to FIGS. 2 and 3.

Figure 2:
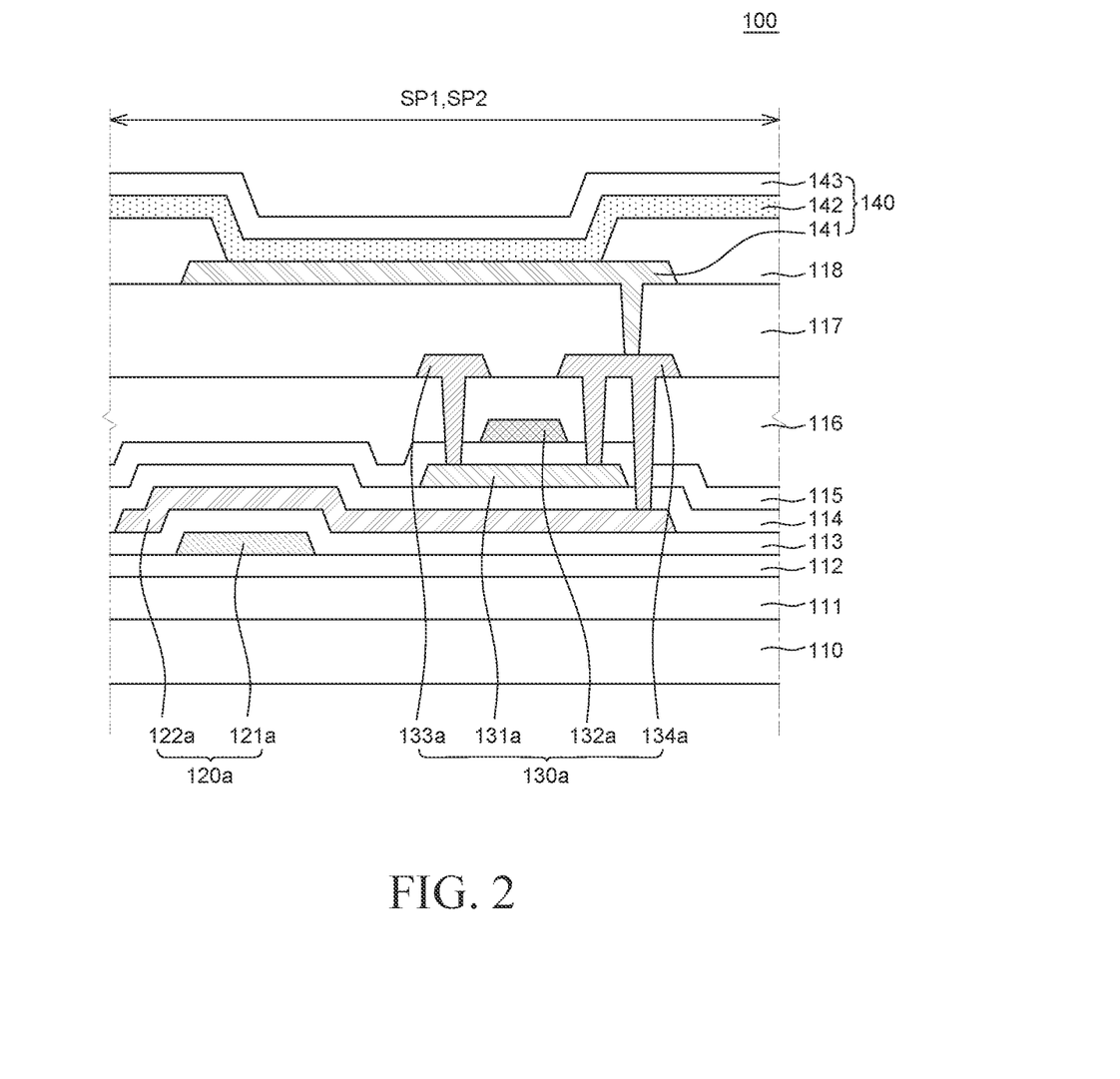
FIGS. 2 and 3 are cross-sectional views of the display device according to an embodiment of the present disclosure.
Figure 3:
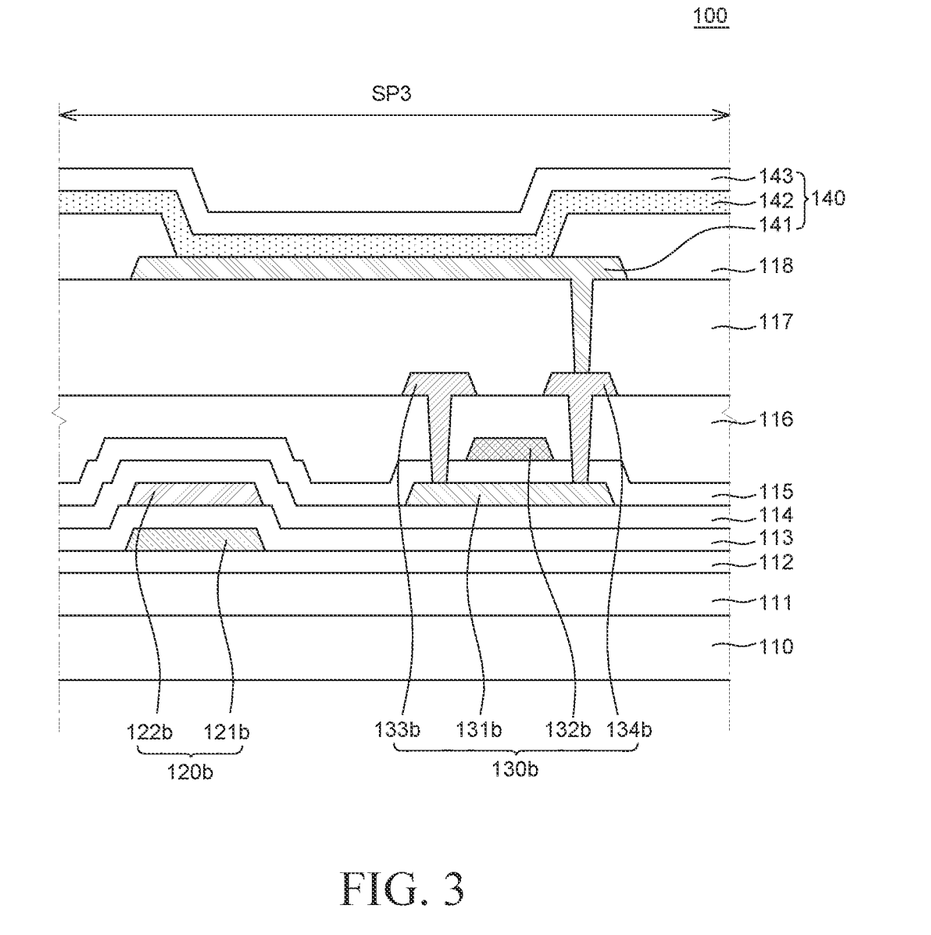

FIGS. 2 and 3 are cross-sectional views of the display device according to an example embodiment of the present disclosure. Particularly, FIG. 2 is a cross-sectional view of the first sub-pixel SP1 and the second sub-pixel SP2 among the plurality of sub-pixels SP of the display device 100. FIG. 3 is a cross-sectional view of the third sub-pixel SP3 among the plurality of sub-pixels SP of the display device 100. That is, among the plurality of sub-pixels SP, the first sub-pixel SP1 and the second sub-pixel SP2 can have the same structure. In addition, among the plurality of sub-pixels SP, the third sub-pixel SP3 can have a structure that is different than the structures of the first sub-pixel SP1 and the second sub-pixel SP2. Also, the transistors 130a and 130b illustrated in FIGS. 2 and 3 can be driving transistors. FIGS. 2 and 3 illustrate only the driving transistors among various transistors disposed in the plurality of sub-pixels SP for convenience of explanation.

In addition, in the display device 100 according to an example embodiment of the present disclosure, at least two types of thin film transistors are formed on the same substrate 110. Here, as at least two types of thin film transistors, an LTPS (low temperature poly-silicon) thin film transistor using a polysilicon material as an active layer and an oxide semiconductor thin film transistor using a metal oxide as an active layer are used. The display device 100 according to the present disclosure can provide an optimal function by disposing the LPTS thin film transistor and the oxide semiconductor thin film transistor on the same substrate 100, even though the LPTS thin film transistor and the oxide semiconductor thin film transistor have different properties.

Specifically, the transistors 130a and 130b illustrated in FIGS. 2 and 3 can be oxide semiconductor thin film transistors. That is, a transistor disposed in the display area of the display panel PN can be formed of an oxide thin film transistor. The oxide semiconductor thin film transistor can be a thin film transistor using an oxide semiconductor material as an active layer. Since the oxide semiconductor material has a bandgap greater than that of a silicon material, electrons do not pass the bandgap in an off state and thus, off-current is low. Since a size of auxiliary capacity can be reduced when the off-current is low, the oxide semiconductor thin film transistor is suitable for a high-resolution display device.

Another type of transistor disposed in the non-display area of the display panel PN can be the LTPS thin film transistor. The LTPS thin film transistor can be a thin film transistor using low temperature poly-silicon (LTPS) as an active layer. Since the polysilicon material has high mobility (100 cm$^3$/Vs or more), low energy consumption, and excellent reliability, it can be applied to a multiplexer MUX and/or the gate driver GD for driving elements that drive thin film transistors for display elements. That is, a transistor constituting the gate driver GD can be the LTPS thin film transistor.

Hereinafter, for convenience of explanation, descriptions will be made on the basis that the transistor of the display area is the oxide semiconductor thin film transistor and the transistor of the gate driver is the LTPS thin film transistor. However, the present disclosure is not limited thereto, and the transistor of the display area can be formed of a combination of an oxide semiconductor thin film transistor and an LTPS thin film transistor.

First, structures of the first sub-pixel SP1 and the second sub-pixel SP2 will be described with reference to FIG. 2. Here, the first sub-pixel SP1 can be a red sub-pixel emitting red light, and the second sub-pixel SP2 can be a green sub-pixel emitting green light.

Referring to FIG. 2, the display device 100 includes the substrate 110, the storage capacitor 120a, the transistor 130a, and the light emitting element 140.

The substrate 110 can support various components of the display device 100. The substrate 110 can be formed of glass or a plastic material having flexibility. When the substrate 110 is formed of a plastic material, it can be formed of, for example, polyimide (PI).

A first buffer layer 111 is disposed on the substrate 110. The first buffer layer 111 can reduce penetration of moisture or impurities through the substrate 110. Also, the first buffer layer 111 can protect the storage capacitors 120a and 120b and the transistors 130a and 130b from impurities, such as alkali ions leaking from the substrate 110. In addition, the first buffer layer 111 can improve adhesion between layers formed thereon and the substrate 110. The first buffer layer 111 can be formed of a single layer of silicon nitride (SiNx) or silicon oxide (SiOx) or multiple layers thereof, but is not limited thereto.

A first gate insulating layer 112 is disposed on the first buffer layer 111. The first gate insulating layer 112 can reduce penetration of moisture or impurities through the substrate 110. The first gate insulating layer 112 can be formed of a single layer of silicon nitride (SiNx) or silicon oxide (SiOx) or multiple layers thereof, but is not limited thereto.

The storage capacitor 120a is disposed on the first gate insulating layer 112. The storage capacitor 120a includes a lower electrode 121a and an upper electrode 122a that overlap each other. Also, the lower electrode 121a can be referred to as a first capacitor electrode, and the upper electrode 122a can be referred to as a second capacitor electrode.

The lower electrode 121a is disposed on the first gate insulating layer 112. The lower electrode 121a may not overlap the transistor 130a. That is, the lower electrode 121a can be disposed to be spaced apart from an area in which the transistor 130a is disposed. The lower electrode 121a can be formed as a single layer or multiple layers formed of any one of molybdenum (Mo), copper (Cu), titanium (Ti), aluminum (Al), chromium (Cr), gold (Au), nickel (Ni), and neodymium (Nd) or alloys thereof.

A first interlayer insulating layer 113 is disposed on the lower electrode 121a. The first interlayer insulating layer 113 can be an insulating layer for insulating the lower electrode 121a and the upper electrode 122a. The first interlayer insulating layer 113 can be composed of a single layer of silicon nitride (SiNx) or silicon oxide (SiOx) or multiple layers thereof, but is not limited thereto.

The upper electrode 122a is disposed on the first interlayer insulating layer 113. The upper electrode 122a can extend from an area overlapping with the lower electrode 121a to an area overlapping with the transistor 130a (e.g., 122a can be made long enough to overlap both 121a and 130a). In particular, the upper electrode 122a can overlap an active layer 131a of the transistor 130a. That is, the upper electrode 122a can overlap the lower electrode 121a and the active layer 131a. Also, the upper electrode 122a can be electrically connected to a source electrode 134a of the transistor 130a (e.g., the source electrode 134a can be connected to both the active layer 131a and the upper electrode 122a of the storage capacitor 120a). The upper electrode 122a can be formed as a single layer or multiple layers formed of any one of molybdenum (Mo), copper (Cu), titanium (Ti), aluminum (Al), chromium (Cr), gold (Au), nickel (Ni), and neodymium (Nd) or alloys thereof. Hereinafter, for convenience of explanation, an area of the upper electrode 122a that overlaps the active layer 131a is defined as a metal layer 122a (e.g., the metal layer portion of 122a disposed under or overlapping with the transistor 130a).

The storage capacitor 120a can be formed in the area where the upper electrode 122a and the lower electrode 121a overlap. The upper electrode 122a overlapping the active layer 131a, that is, the metal layer 122a can serve as a protective layer. Electromagnetic waves or external light that is transmitted to the transistor 130a can be blocked by the metal layer 122a. Also, the metal layer 122a overlapping the active layer 131a can serve to adjust an S-factor of the transistor 130a.

Specifically, in the situation of the first sub-pixel SP1 and the second sub-pixel SP2, the metal layer 122a and the active layer 131a can be disposed adjacent to each other with only a second buffer layer 114 interposed therebetween (e.g., the metal layer 122a and the active layer 131a can overlap each other in a vertical direction that is perpendicular to the substrate 110). On the other hand, in the situation of the third sub-pixel SP3 to be described later, an upper electrode 122b is not disposed below the active layer 131b (e.g., upper electrode 122b is spaced apart from the transistor 130b, and the upper electrode 122b and the transistor 130b do not overlap each other in a vertical direction that is perpendicular to the substrate 110). Accordingly, the first sub-pixel SP1 and the second sub-pixel SP2 can both have a higher S-factor than the S-factor of the third sub-pixel SP3. Accordingly, it is possible to secure an appropriate range of data voltages in the first sub-pixel SP1, the second sub-pixel SP2, and the third sub-pixel SP2. This will be described in more detail below.

In addition, the LTPS thin film transistor constituting the gate driver GD can be disposed on the first buffer layer 111. That is, the first buffer layer 111 can be an insulating layer for preventing moisture or impurities from penetrating into the LTPS thin film transistor through the substrate 110. The active layer of the LTPS thin film transistor can be disposed on the first buffer layer 111. A gate electrode of the LTPS thin film transistor can be formed of the same material as the lower electrode 121a, on the first gate insulating layer 112. A source electrode and a drain electrode of the LTPS thin film transistor can be formed of the same material on the same layer as any one of the upper electrode 122a, the active layer 131a, a gate electrode 132a, a source electrode 134a, and a drain electrode 133a. However, the present disclosure is not limited thereto.

The second buffer layer 114 is disposed on the storage capacitor 120a. The second buffer layer 114 can be an insulating layer for insulating the metal layer 122a and the active layer 131a. Also, the second buffer layer 114 can be a buffer layer for protecting the active layer 131a of the transistor 130a. The second buffer layer 114 can be composed of a single layer of silicon nitride (SiNx) or silicon oxide (SiOx) or multiple layers thereof, but is not limited thereto.

The transistor 130a is disposed on the second buffer layer 114. The transistor 130a can drive the light emitting element 140. The transistor 130a includes the active layer 131a, the gate electrode 132a, the source electrode 134a, and the drain electrode 133a. Also, depending on a design of the driving circuit, the source electrode 134a can be configured as a drain electrode, and the drain electrode 133a can be configured as a source electrode.

The active layer 131a is disposed on the second buffer layer 114. The active layer 131a is an area in which a channel is formed when the transistor 130a is driven. The active layer 131a can include a channel region, a source region, and a drain region. The active layer 131a can be formed of a semiconductor material such as an oxide semiconductor, amorphous silicon, or polysilicon, but is not limited thereto. Hereinafter, descriptions will be made based on the active layer 131a being formed of an oxide semiconductor.

A second gate insulating layer 115 is disposed on the active layer 131a. The second gate insulating layer 115 can be an insulating layer for insulating the active layer 131a and the second gate insulating layer 115. Contact holes for respectively connecting the source electrode 134a and the drain electrode 133a to the active layer 131a are formed in the second gate insulating layer 115. The second gate insulating layer 115 can be composed of a single layer of silicon nitride (SiNx) or silicon oxide (SiOx) or multiple layers thereof, but is not limited thereto.

The gate electrode 132a is disposed on the second gate insulating layer 115. The gate electrode 132a can be disposed to overlap the channel region of the active layer 131a. The gate electrode 132a can be formed as a single layer or multiple layers formed of any one of molybdenum (Mo), copper (Cu), titanium (Ti), aluminum (Al), chromium (Cr), gold (Au), nickel (Ni), and neodymium (Nd) or alloys thereof.

A second interlayer insulating layer 116 is disposed on the gate electrode 132a. Contact holes for respectively connecting the source electrode 134a and the drain electrode 133a to the active layer 131a are formed in the second interlayer insulating layer 116. The second interlayer insulating layer 116 can be composed of a single layer of silicon nitride (SiNx) or silicon oxide (SiOx) or multiple layers thereof, but is not limited thereto.

The source electrode 134a and the drain electrode 133a are disposed on the second interlayer insulating layer 116. The source electrode 134a and the drain electrode 133a can be in contact with the source region and the drain region of the active layer 131a, respectively through the contact holes formed in the second gate insulating layer 115 and the second interlayer insulating layer 116. The source electrode 134a and the drain electrode 133a can be formed as a single layer or multiple layers formed of any one of molybdenum (Mo), copper (Cu), titanium (Ti), aluminum (Al), chromium (Cr), gold (Au), nickel (Ni), and neodymium (Nd) or alloys thereof.

A planarization layer 117 is disposed on the transistor 130a. The planarization layer 117 is an insulating layer that planarizes an upper portion of the substrate 110. The planarization layer 117 can be formed of an organic material, for example, a single layer or a multilayer of polyimide or photo acryl, but is not limited thereto.

The light emitting element 140 is disposed on the planarization layer 117. The light emitting element 140 includes a first electrode 141, a light emitting layer 142, and a second electrode 143. Here, the first electrode 141 can be an anode electrode, and the second electrode 143 can be a cathode electrode.

In addition, the display device 100 can be implemented in a top emission method or a bottom emission method. In the situation of the top emission method, a reflective layer for reflecting light emitted from the light emitting layer 142 toward the second electrode 143 can be disposed below the first electrode 141. For example, the reflective layer can include a material having excellent reflectivity, such as aluminum (Al) or silver (Ag), but is not limited thereto. On the other hand, in the situation of the bottom emission method, the first electrode 141 can be formed of only a transparent conductive material. Hereinafter, it is assumed that the display device 100 according to an example embodiment of the present disclosure is a top emission type.

The first electrode 141 is disposed on the planarization layer 117. The first electrode 141 can correspond to each of the plurality of sub-pixels SP. The first electrode 141 can be electrically connected to the source electrode 134a of the transistor 130a through a contact hole formed in the planarization layer 117. The first electrode 141 can be formed of a conductive material having a high work function in order to supply holes to the light emitting layer 142. The first electrode 141 can be formed in a multilayer structure including a transparent conductive layer and an opaque conductive layer having high reflective efficiency. The transparent conductive layer can be formed of a material having a relatively large work function value, such as indium tin oxide (ITO) or indium zinc oxide (IZO). The opaque conductive layer can be formed in a single layer or multilayer structure including Al, Ag, Cu, Pb, Mo, Ti, or an alloy thereof. However, a material of the first electrode 141 is not limited thereto.

A bank 118 is disposed on the first electrode 141 and the planarization layer 117. The bank 118 can be formed on the planarization layer 117 to cover an edge of the first electrode 141. The bank 118 is an insulating layer disposed between the plurality of sub-pixels SP to separate the plurality of sub-pixels SP. The bank 118 can be an organic insulating material. For example, the bank 118 can be formed of polyimide, acryl, or benzocyclobutene (BCB)-based resin, but is not limited thereto.

The light emitting layer 142 is disposed on the first electrode 141 and the bank 118. The light emitting layer 142 can be formed over an entire surface of the substrate 110. That is, the light emitting layer 142 can be a common layer that is formed in the plurality of sub-pixels SP in common. The light emitting layer 142 can be an organic layer for emitting light of a specific color. For example, the light emitting layer 142 can be one of a red light emitting layer, a green light emitting layer, a blue light emitting layer, and a white light emitting layer. When the light emitting layer 142 is formed of a white light emitting layer, a color filter can be further disposed on the light emitting element 140. The light emitting layer 142 can further include various layers, such as a hole transport layer, a hole injection layer, a hole blocking layer, an electron injection layer, an electron blocking layer, an electron transport layer, and the like.

The second electrode 143 is disposed on the light emitting layer 142. The second electrode 143 can be formed as a single layer over the entire surface of the substrate 110. That is, the second electrode 143 can be a common layer that is formed in the plurality of sub-pixels SP in common. Since the second electrode 143 supplies electrons to the light emitting layer 142, the second electrode 143 can be formed of a conductive material having a low work function. The second electrode 143 can be formed of, for example, a transparent conductive material such as indium tin oxide (ITO) or indium zinc oxide (IZO), a metal alloy such as MgAg, or an ytterbium (Yb) alloy or the like, and can further include a metal-doped layer, but the present disclosure is not limited thereto.

Next, a structure of the third sub-pixel SP3 will be described with reference to FIG. 3. Here, the third sub-pixel SP3 can be a blue sub-pixel emitting blue light. Configurations disposed in the third sub-pixel SP3 are the same as those of the first sub-pixel SP1 and the second sub-pixel SP2 except for the storage capacitor 120b and the transistor 130b, and thus, a redundant description will be omitted or may be briefly provided.

Referring to FIG. 3, the storage capacitor 120b and the transistor 130b are disposed in the third sub-pixel SP3. In this situation, the storage capacitor 120b and the transistor 130b do not overlap each other (e.g., the storage capacitor 120b is spaced apart from the transistor 130b in the horizontal direction).

The storage capacitor 120b is disposed on the first gate insulating layer 112. The storage capacitor 120b includes a lower electrode 121b and the upper electrode 122b that overlap each other. Here, the lower electrode 121b disposed in the third sub-pixel SP3 can be formed of the same material by the same process as the lower electrode 121a disposed in the first sub-pixel SP1 and the second sub-pixel SP2. Also, the upper electrode 122b disposed in the third sub-pixel SP3 can be formed of the same material by the same process as the upper electrode 122a disposed in the first sub-pixel SP1 and the second sub-pixel SP2.

The transistor 130b is disposed on the second buffer layer 114. The transistor 130b includes an active layer 131b, a gate electrode 132b, a source electrode 134b, and a drain electrode 133b. Here, the active layer 131b disposed in the third sub-pixel SP3 can be formed of the same material by the same process as the active layer 131a disposed in the first sub-pixel SP1 and the second sub-pixel SP2. The gate electrode 132b disposed in the third sub-pixel SP3 can be formed of the same material by the same process as the gate electrode 132a disposed in the first sub-pixel SP1 and the second sub-pixel SP2. The source electrode 134b and the drain electrode 133b disposed in the third sub-pixel SP3 can be formed of the same material by the same process as the source electrode 134a and the drain electrode 133a disposed in the first sub-pixel SP1 and the second sub-pixel SP2.

In the situation of the third sub-pixel SP3, the upper electrode 122b of the storage capacitor 120b does not overlap the transistor 130b. That is, the upper electrode 122b is not disposed below the active layer 131b of the transistor 130b (e.g., the upper electrode 122b is spaced apart from the active layer 131b in the horizontal direction). Accordingly, the third sub-pixel SP3 can have a lower S-factor than the first sub-pixel SP1 and the second sub-pixel SP2. Accordingly, an appropriate range of data voltages in the third sub-pixel SP3 can be secured.

Hereinafter, the S-factor will be described with reference to FIGS. 4A and 4B.

Figure 4A:
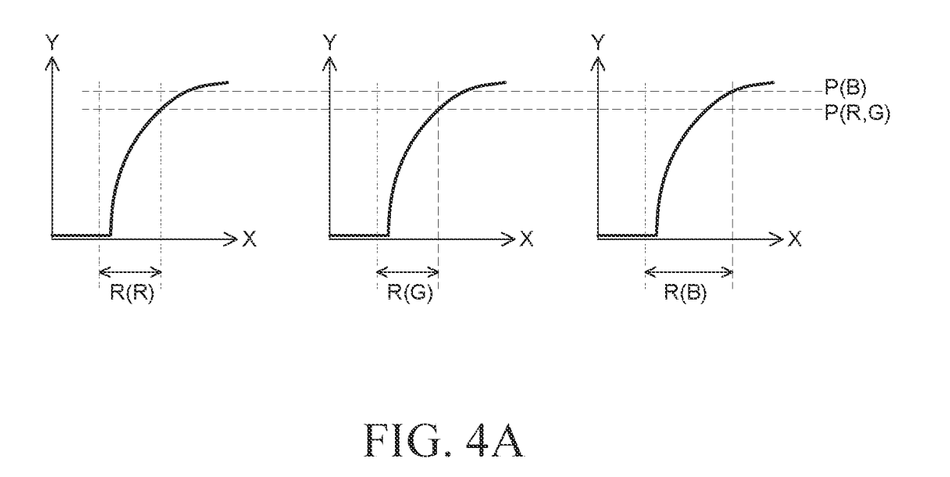
FIGS. 4A and 4B are graphs for explaining an S-factor according to embodiments of the present disclosure.
Figure 4B:
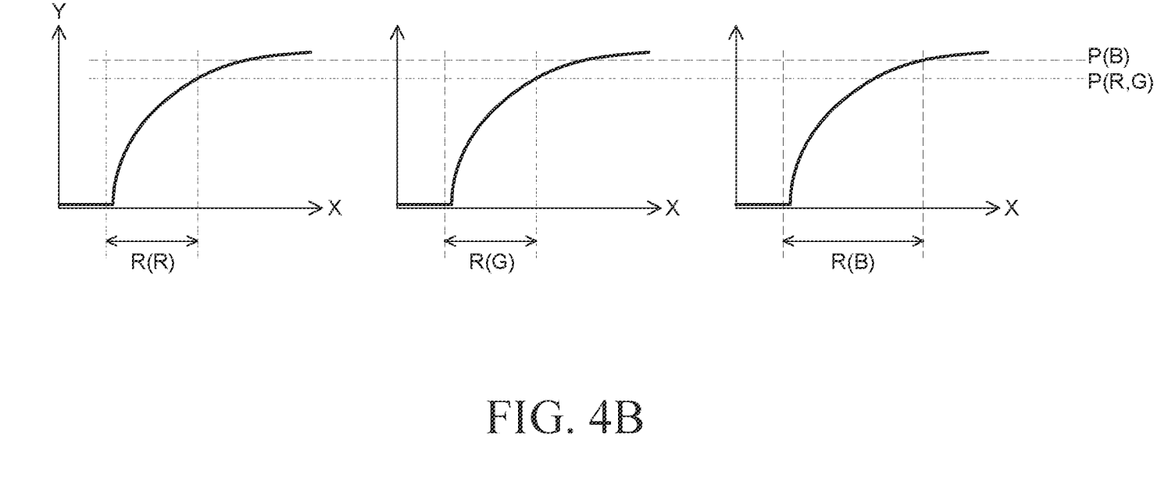

FIGS. 4A and 4B are graphs for explaining the S-factor. Particularly, FIGS. 4A and 4B are graphs of required currents according to data voltages for expressing gray scale. Specifically, an X-axis can preferably mean a voltage, and a Y-axis can preferably mean a current. Also, in each of FIG. 4A and FIG. 4B, a first graph is a graph corresponding to a red sub-pixel, a second graph is a graph corresponding to a green sub-pixel, and a third graph is a graph corresponding to a blue sub-pixel. FIG. 4A illustrates a situation in which a structure having a relatively low S-factor is applied to all of the red sub-pixel, the green sub-pixel, and the blue sub-pixel. FIG. 4B illustrates a situation in which a structure having a relatively high S-factor is applied to all of the red sub-pixel, the green sub-pixel, and the blue sub-pixel.

Referring to FIGS. 4A and 4B, P(R,G) is a point representing a required current corresponding to white in the red sub-pixel and the green sub-pixel. Further, P(B) is a point representing a required current corresponding to white in the blue sub-pixel. A lowest point of the Y-axis is a point representing a required current corresponding to black in the red sub-pixel, the green sub-pixel, and the blue sub-pixel.

In addition, R(R) represents a range of data voltages for expressing black to white in the red sub-pixel. R(G) represents a range of data voltages for expressing black to white in the green sub-pixel. R(B) represents a range of data voltages for expressing black to white in the blue sub-pixel.

In general, since the blue sub-pixel uses a light emitting layer of a fluorescent material, current efficiency in the blue sub-pixel may be lower than those of the red sub-pixel and the green sub-pixel using a light emitting layer of a phosphor material. Accordingly, in order to achieve high luminance, voltage and current values corresponding to white in the blue sub-pixel may be higher than voltage and current values corresponding to white in the red sub-pixel and the green sub-pixel. That is, P(B) may be located at a point higher than P(R,G). Also, the range of data voltages in the blue sub-pixel may be wider than the ranges of the data voltage in the red sub-pixel and the green sub-pixel.

In general, an S-factor of a transistor can be adjusted by disposing a metal layer at a lower portion of the transistor. In this situation, the metal layer can be connected to a source electrode of the transistor. The smaller a distance between an active layer of the transistor and the metal layer disposed below the active layer, the greater the S-factor. That is, the smaller the distance between the active layer and the metal layer, the greater a component that interferes with field generated in a gate electrode of the transistor, so that the S-factor increases. Conversely, the greater the distance between the active layer and the metal layer, the S-factor decreases That is, the greater the distance between the active layer and the metal layer, the smaller the component that interferes with the field generated in the gate electrode of the transistor, and the smaller the S-factor may be. In addition, when the metal layer does not exist below the active layer, there is no component that interferes with the field, so the S-factor can be the lowest.

In general, as the S-factor is higher, the range of data voltages for expressing gray scale is widened, and as the S-factor is lower, the range of data voltages for expressing gray scale is narrowed. Specifically, when comparing the graph of FIG. 4A to which a structure having a low S-factor is applied and the graph of FIG. 4B to which a structure having a high S-factor is applied, it can be seen that the lower the S-factor, the narrower the range of data voltages, and the higher the S-factor, the wider the range of data voltages.

As illustrated in FIG. 4A, when the S-factor of the transistor is configured to be relatively low, the range of data voltages can be relatively narrowed. As the range of data voltages is narrowed, a slope of the graph increases, so that discrimination between data voltages can be reduced. That is, gray scale of a pixel can be rapidly changed according to small changes in the data voltage, which can cause mura at low gray scale. In particular, since the red sub-pixel and the green sub-pixel have higher efficiency than the blue sub-pixel, they have ranges of data voltages that are smaller than that of the blue sub-pixel. Accordingly, when the S-factor is configured to be low, the ranges of data voltages in the red sub-pixel and the green sub-pixel are too narrow, thereby causing vulnerability to mura at low gray scale.

As shown in FIG. 4B, when the S-factor of the transistor is configured to be relatively high, the range of data voltages can be relatively widened. As the range of data voltages is widened, a slope of the graph is more gentle, so that discrimination between data voltages can be improved. That is, since gray scale of pixel can be easily adjusted according to changes in data voltage, mura at the low gray scale can be improved (e.g., a high S-factor can allow for gray scale adjustments that are less sensitive to small changes in voltage). However, when the range of data voltages is too wide, power consumption increases, and a voltage required to achieve peak luminance of white may exceed a specification of a data driver (e.g., because the data driver might not be able to supply enough power when the S-factor of a pixel is set too high). Here, the specification of the data driver can mean a range of voltages that can be provided by the data driver. In particular, since the blue sub-pixel has lower efficiency than the red sub-pixel and the green sub-pixel, it can have a range of data voltages that is wider than those of the red sub-pixel and the green sub-pixel. Accordingly, when the S-factor is configured to be high, the range of data voltages in the blue sub-pixel is too wide, and thus may be outside of the specification of the data driver.

As a result, as the S-factor increases, mura at low gray scale can be improved, but power consumption may increase, and the range of a required data voltage may exceed the specification of the data driver. On the other hand, as the S-factor is lower, power consumption may decrease, and a range of a required data voltage can satisfy the specifications of the data driver, but may cause vulnerability to mura at low gray scale values. Also, since the efficiency of the light emitting element is different in each sub-pixel, the range of data voltages according to the S-factor can also be different for each sub-pixel. Accordingly, when the same structure is applied to all of the plurality of sub-pixels, mura at low gray scale may occur in a specific sub-pixel or there may occur problems that a range of data voltages is outside of the specification of the data driver.

Accordingly, in the display device 100 according to an example embodiment of the present disclosure, different structures can be applied in the respective sub-pixels SP (e.g., different colored sub-pixels made have a different structure in order to provide more similar S-factors among the sub-pixels). That is, distances between the active layers 131a and 131b and the electrodes 121a, 122a, 121b, and 122b can be differently configured in the plurality of respective sub-pixels SP. Specifically, the metal layer 122a extending from the upper electrode 122a can be disposed below the active layer 131a in the first sub-pixel SP1 and the second sub-pixel SP2. In other words, the metal layer 122a can extend from the upper electrode 122a to overlap with the active layer 131a in the first sub-pixel SP1 and the second sub-pixel SP2. On the other hand, in the third sub-pixel SP3, the metal layer is not disposed below the active layer 131b. Accordingly, the S-factor of the first sub-pixel SP1 and the second sub-pixel SP2 is higher than that of the third sub-pixel SP3, and the S-factor of the third sub-pixel SP3 is lower than that of the first sub-pixel SP1 and the second sub-pixel SP2. Accordingly, the efficiency of each sub-pixel SP can be improved by applying an S-factor that is optimized for each sub-pixel SP.

More specifically, a high S-factor can be applied to the first sub-pixel SP1 that is the red sub-pixel and the second sub-pixel SP2 that is the green sub-pixel. That is, the metal layer 122a can be disposed below the active layer 131a in the first sub-pixel SP1 and the second sub-pixel SP2. The metal layer 122a can extend from the upper electrode 122a of the storage capacitor 120a between the first interlayer insulating layer 113 and the second buffer layer 114. In this situation, only one second buffer layer 114 can be disposed between the active layer 131a and the metal layer 122a that overlap each other. Thus, the transistor 130a of the first sub-pixel SP1 and the second sub-pixel SP2 can have a higher S-factor than the third sub-pixel SP3. Accordingly, the first sub-pixel SP1 and the second sub-pixel SP2 can utilize a wide data voltage range. Accordingly, mura at low gray scale of the first sub-pixel SP1 and the second sub-pixel SP2 can be improved.

A low S-factor can be applied to the third sub-pixel SP3 that is a blue sub-pixel. That is, the lower electrode 121b or the upper electrode 122b is not disposed below the active layer 131b of the third sub-pixel SP3. Accordingly, the first gate insulating layer 112 and the first interlayer insulating layer 113 can be in contact with each other, and the first interlayer insulating layer 113 and the second buffer layer 114 can be in contact with each other. In other words, the active layer 131b of the third sub-pixel SP3 does not overlap the lower electrode 121b or the upper electrode 122b (e.g., the active layer 131b of the third sub-pixel SP3 can be spaced apart from the upper electrode 122b in the horizontal direction, see FIG. 3). Thus, the transistor 130b of the third sub-pixel SP3 can have a lower S-factor than that of the first sub-pixel SP1 and the second sub-pixel SP2. Accordingly, the range of data voltages in the third sub-pixel SP3 can be maintained at an appropriate level. Accordingly, the range of data voltages for expressing the gray scale of the third sub-pixel SP3 can satisfy the specification of the data driver DD.

In addition, all of the first sub-pixel SP1, the second sub-pixel SP2, and the third sub-pixel SP3 can be configured to utilize the ranges of voltages capable of being provided by the data driver DD, as much as possible. That is, the ranges of data voltages in the plurality of sub-pixels SP can be set so that they are not too wide or too narrow and can be set to appropriate levels. Accordingly, it is possible to easily adjust the gray scale of pixel by utilizing the voltage range of the data driver DD as much as possible. Accordingly, the quality of the display device 100 can be improved.

Figure 5:
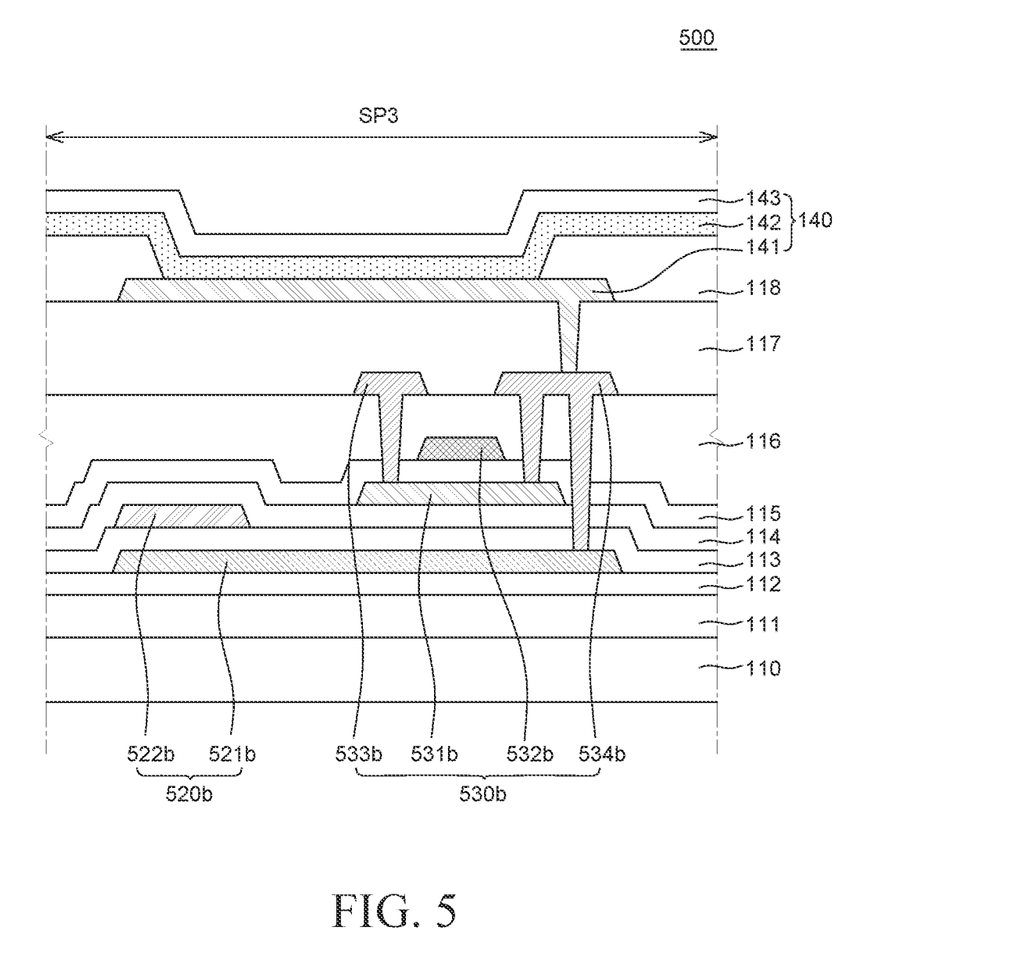
FIG. 5 is a cross-sectional view of a display device according to another embodiment of the present disclosure.

FIG. 5 is a cross-sectional view of a display device according to another example embodiment of the present disclosure. Compared to the display device 100 of FIGS. 2 and 3, a display device 500 of FIG. 5 has the same or similar configuration except for a storage capacitor 520b and a transistor 530b of the third sub-pixel SP3. Accordingly, redundant descriptions will be omitted or may be briefly provided.

Referring to FIG. 5, the storage capacitor 520b and the transistor 530b are disposed on the substrate 110 corresponding to the third sub-pixel SP3.

The storage capacitor 520b is disposed on the first gate insulating layer 112. The storage capacitor 520b includes a lower electrode 521b and an upper electrode 522b that overlap each other. Here, the lower electrode 521b disposed in the third sub-pixel SP3 can be formed of the same material by the same process as the lower electrode 121a disposed in the first sub-pixel SP1 and the second sub-pixel SP2. Also, the upper electrode 522b disposed in the third sub-pixel SP3 can be formed of the same material by the same process as the upper electrode 122a disposed in the first sub-pixel SP1 and the second sub-pixel SP2.

The transistor 530b is disposed on the second buffer layer 114. The transistor 530b includes an active layer 531b, a gate electrode 532b, a source electrode 534b, and a drain electrode 533b. Here, the active layer 531b disposed in the third sub-pixel SP3 can be formed of the same material by the same process as the active layer 531a disposed in the first sub-pixel SP1 and the second sub-pixel SP2. The gate electrode 532b disposed in the third sub-pixel SP3 can be formed of the same material by the same process as the gate electrode 532a disposed in the first sub-pixel SP1 and the second sub-pixel SP2. The source electrode 534b and the drain electrode 533b disposed in the third sub-pixel SP3 can be formed of the same material by the same process as the source electrode 534a and the drain electrode 533a disposed in the first sub-pixel SP1 and the second sub-pixel SP2.

In the third sub-pixel SP3, the lower electrode 521b of the storage capacitor 520b does overlap with the transistor 530b. In this situation, the upper electrode 522b does not overlap with the transistor 530b. That is, the upper electrode 522b can be spaced apart from an area in which the transistor 530b is disposed. However, the lower electrode 521b can extend from an area overlapping the upper electrode 522b to an area overlapping the transistor 530b. In particular, the lower electrode 521b can overlap the active layer 531b of the transistor 530b (e.g., 521b and 531b overlap with each other in a vertical direction that is perpendicular to the substrate 110). Also, the lower electrode 521b may be electrically connected to the source electrode 534b of the transistor 530b. Hereinafter, for convenience of explanation, an area of the lower electrode 521b overlapping the active layer 531b is defined as a metal layer 521b.

In the first sub-pixel SP1 and the second sub-pixel SP2, the metal layer 122a overlaps the active layer 131a. The metal layer 122a can extend from the upper electrode 122a to overlap with the active layer 131a in the first sub-pixel SP1 and the second sub-pixel SP2. In this situation, the second buffer layer 114 may be disposed between the metal layer 122a and the active layer 131a. In the third sub-pixel SP3, the metal layer 521b overlaps the active layer 531b. The metal layer 521b may be extended from the lower electrode 521b to overlap with the active layer 531b in the third sub-pixel SP3. In this situation, the first interlayer insulating layer 113 and the second buffer layer 114 may be disposed between the metal layer 521b and the active layer 531b. That is, a distance between the metal layer 122a and the active layer 131a in the first sub-pixel SP1 and the second sub-pixel SP2 is smaller than a distance between the metal layer 521b and the active layer 531b in the third sub-pixel SP3 (e.g., the first and second sub-pixels SP1, SP2 can have one layer between the metal layer 122a and the transistor 130a, while the third sub-pixel SP3 can have two layers between the metal layer 521b and the transistor 530b). Accordingly, the S-factor of the first sub-pixel SP1 and the second sub-pixel SP2 may be greater than the S-factor of the third sub-pixel SP3.

In the display device 500 according to another example embodiment of the present disclosure, a high S-factor may be applied to the first sub-pixel SP1 that is the red sub-pixel and the second sub-pixel SP2 that is the green sub-pixel. Also, a low S-factor may be applied to the third sub-pixel SP3 that is a blue sub-pixel. Accordingly, the plurality of sub-pixels SP may allow for easy adjustment of gray scale of pixel by securing an appropriate range of data voltages while preventing mura at low gray scale. In addition, since the metal layer 521b is disposed below the transistor 530b, the transistor 530b can be better protected from electromagnetic waves or external light. Accordingly, quality and reliability of the display device 500 can be improved.

The example embodiments of the present disclosure can also be described as follows:

According to an aspect of the present disclosure, a display device includes a substrate including a plurality of sub-pixels; a storage capacitor in the plurality of sub-pixels on the substrate; a buffer layer on the storage capacitor; a transistor in the plurality of sub-pixels on the buffer layer; and a light emitting element on the transistor. The plurality of sub-pixels include a first sub-pixel, a second sub-pixel, and a third sub-pixel that emit light of different colors. At least one of the plurality of sub-pixels includes a metal layer disposed below the transistor. The metal layer is connected to one of electrodes of the storage capacitor.

The metal layer can overlap an active layer of the transistor.

The metal layer can be disposed only in the first sub-pixel and the second sub-pixel.

The transistor can be a driving transistor for driving the light emitting element.

The storage capacitor can include a lower electrode on the substrate; and an upper electrode on the lower electrode and overlapping the lower electrode. The metal layer can be extended from the upper electrode to overlap with the active layer.

The metal layer may be not disposed in the third sub-pixel.

The first sub-pixel can be a red sub-pixel, the second sub-pixel can be a green sub-pixel, and the third sub-pixel may be a blue sub-pixel.

The metal layer may be disposed in each of the first sub-pixel, the second sub-pixel, and the third sub-pixel. The metal layer in the first sub-pixel and the second sub-pixel and the metal layer in the third sub-pixel can be disposed on different layers.

The storage capacitor can include a lower electrode on the substrate; and an upper electrode on the lower electrode and overlapping the lower electrode. The metal layer in the first sub-pixel and the second sub-pixel can be extended from the upper electrode. The metal layer in the third sub-pixel can be extended from the lower electrode.

The first sub-pixel can be a red sub-pixel, the second sub-pixel can be a green sub-pixel, and the third sub-pixel can be a blue sub-pixel.

The storage capacitor can include a lower electrode and an upper electrode overlapping each other. An interlayer insulating layer can be disposed between the lower electrode and the upper electrode. The metal layer can be disposed between the interlayer insulating layer and the buffer layer in an area overlapping the transistor of the first sub-pixel and the second sub-pixel. The interlayer insulating layer and the buffer layer can be in contact with each other in an area overlapping the transistor of the third sub-pixel.

The transistor can further include a source electrode connected to the light emitting element. The metal layer can be electrically connected to the source electrode.

The transistor can be an oxide semiconductor thin film transistor using a metal oxide as an active layer.

According to another aspect of the present disclosure, a display device includes a substrate including a plurality of sub-pixels; a first capacitor electrode at each of the plurality of sub-pixels; an interlayer insulating layer on the first capacitor electrode; a second capacitor electrode on the interlayer insulating layer to overlap the first capacitor electrode; a buffer layer on the second capacitor electrode; a transistor on the buffer layer and including an active layer; and a light emitting element on the transistor. The plurality of sub-pixels include a first sub-pixel, a second sub-pixel, and a third sub-pixel that emit light of different colors. In the first sub-pixel and the second sub-pixel, the second capacitor electrode is configured to extend from an area overlapping the first capacitor electrode to an area overlapping the active layer.

The second capacitor electrode can be disposed between the interlayer insulating layer and the buffer layer in the area overlapping the active layer in the first sub-pixel and the second sub-pixel. The interlayer insulating layer and the buffer layer can be in direct contact with each other in an area overlapping the active layer in the third sub-pixel.

The transistor can further include a source electrode connected to the light emitting element. The second capacitor electrode in the first sub-pixel and the second sub-pixel can be electrically connected to the source electrode.

In the third sub-pixel, the first capacitor electrode and the second capacitor electrode may not overlap the active layer.

In the third sub-pixel, the first capacitor electrode can be configured to extend from an area overlapping the second capacitor electrode to an area overlapping the active layer.

The transistor can further include a source electrode connected to the light emitting element. The first capacitor electrode in the third sub-pixel can be electrically connected to the source electrode.

A distance between the second capacitor electrode and the active layer in the first sub-pixel and the second sub-pixel can be smaller than a distance between the first capacitor electrode and the active layer in the third sub-pixel.

The first sub-pixel can be a red sub-pixel, the second sub-pixel can be a green sub-pixel, and the third sub-pixel can be a blue sub-pixel.

According to yet another aspect of the present disclosure, a display device includes a substrate including a display area having a plurality of sub-pixels and a non-display area surrounding the display area; a storage capacitor in the plurality of sub-pixels on the substrate; a buffer layer on the storage capacitor; a transistor in the plurality of sub-pixels on the buffer layer; a light emitting element on the transistor of the display area, and a metal layer disposed below the transistor. The plurality of sub-pixels include a first sub-pixel, a second sub-pixel, and a third sub-pixel that emit light of different colors. The metal layer is disposed in each of the first sub-pixel, the second sub-pixel, and the third sub-pixel. The metal layer in the first sub-pixel and the second sub-pixel and the metal layer in the third sub-pixel are disposed on different layers.

Although the example embodiments of the present disclosure have been described in detail with reference to the accompanying drawings, the present disclosure is not limited thereto and can be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
a plurality of sub-pixels disposed on a substrate;
a storage capacitor disposed in each of the plurality of sub-pixels;
a buffer layer disposed on the storage capacitor in each of the plurality of sub-pixels;
a transistor disposed on the buffer layer in each of the plurality of sub-pixels; and
a light emitting element disposed on the transistor in each the plurality of sub-pixels,
wherein the plurality of sub-pixels include a first sub-pixel, a second sub-pixel, and a third sub-pixel, each of the first, second and third sub-pixels being configured to emit a different color of light,
wherein at least one of the plurality of sub-pixels includes a metal layer disposed below the transistor,
wherein the metal layer is connected to one electrode of the storage capacitor,
wherein the first sub-pixel is a red sub-pixel, the second sub-pixel is a green sub-pixel, and the third sub-pixel is a blue sub-pixel,
wherein the transistor is a driving transistor for driving the light emitting element, and
wherein a driving transistor of the third sub-pixel has a lower S-factor than that of a driving transistor of the first sub-pixel and the second sub-pixel.

2. The display device of claim 1, wherein the metal layer overlaps with an active layer of the transistor in the at least one of the plurality of sub-pixels.

3. The display device of claim 2, wherein the storage capacitor in the at least one of the plurality of sub-pixels includes:
a lower electrode disposed on the substrate; and
an upper electrode overlapping with the lower electrode,
wherein the metal layer extends from the upper electrode to overlap with the active layer in the at least one of the plurality of sub-pixels.

4. The display device of claim 1, wherein the metal layer is only disposed below the transistor in each of the first sub-pixel and the second sub-pixel.

5. The display device of claim 4, wherein the metal layer disposed below the transistor is absent from the third sub-pixel.

6. The display device of claim 1, wherein each of the first sub-pixel, the second sub-pixel, and the third sub-pixel includes the metal layer disposed below the transistor, and
wherein the metal layer disposed below the transistor in the third sub-pixel is disposed on a different layer than the metal layers disposed below the transistors in the first and second sub-pixels.

7. The display device of claim 6, wherein the storage capacitor in each of the first, second and third sub-pixels includes:
a lower electrode disposed on the substrate; and
an upper electrode overlapping with the lower electrode,
wherein the metal layers in the first and second sub-pixels extend from the corresponding upper electrode, and
wherein the metal layer in the third sub-pixel extends from the lower electrode in the third sub-pixel.

8. The display device of claim 1, wherein the storage capacitor in the at least one of the plurality of sub-pixels includes a lower electrode and an upper electrode overlapping with each other,
wherein an interlayer insulating layer is disposed between the lower electrode and the upper electrode,
wherein each of the first and second sub-pixels include the metal layer disposed between the interlayer insulating layer and the buffer layer in an area overlapping with the transistor, respectively, and wherein the interlayer insulating layer and the buffer layer are in contact with each other in an area overlapping with the transistor of the third sub-pixel.

9. The display device of claim 1, wherein the transistor in the at least one of the plurality of sub-pixels further includes a source electrode connected to the light emitting element, and
wherein the metal layer disposed below the transistor is electrically connected to the source electrode.

10. The display device of claim 1, wherein the transistor in each of the plurality of sub-pixels is an oxide semiconductor thin film transistor having a metal oxide as an active layer.

11. A display device, comprising:
a plurality of sub-pixels disposed on a substrate;
a first capacitor electrode disposed in each of the plurality of sub-pixels;
an interlayer insulating layer disposed on the first capacitor electrode in each of the plurality of sub-pixels;
a second capacitor electrode disposed on the interlayer insulating layer and overlapping with the first capacitor electrode in each of the plurality of sub-pixels;
a buffer layer disposed on the second capacitor electrode in each of the plurality of sub-pixels;
a transistor disposed on the buffer layer and including an active layer in each of the plurality of sub-pixels; and
a light emitting element disposed on the transistor in each of the plurality of sub-pixels,
wherein the plurality of sub-pixels include a first sub-pixel, a second sub-pixel, and a third sub-pixel, each of the first, second and third sub-pixels being configured to emit a different color of light,
wherein the second capacitor electrode in each of the first and second sub-pixels extends from an area overlapping with the first capacitor electrode to an area overlapping the active layer, respectively,
wherein the first sub-pixel is a red sub-pixel, the second sub-pixel is a green sub-pixel, and the third sub-pixel is a blue sub-pixel,
wherein the transistor is a driving transistor for driving the light emitting element, and
wherein a driving transistor of the third sub-pixel has a lower S-factor than that of a driving transistor of the first sub-pixel and the second sub-pixel.

12. The display device of claim 11, wherein the second capacitor electrode in each of the first and second sub-pixels is disposed between the interlayer insulating layer and the buffer layer in the area overlapping the active layer, respectively, and
wherein the interlayer insulating layer and the buffer layer are in direct contact with each other in an area overlapping with the active layer in the third sub-pixel.

13. The display device of claim 11, wherein the transistor in each of the plurality of sub-pixels further includes a source electrode connected to the light emitting element, and
wherein the second capacitor electrode in the first and second sub-pixels is electrically connected to the corresponding source electrode.

14. The display device of claim 11, wherein the first and second capacitor electrodes in the third sub-pixel do not overlap the active layer in the third sub-pixel.

15. The display device of claim 11, wherein in the third sub-pixel, the first capacitor electrode extends from an area overlapping with the second capacitor electrode in the third sub-pixel to an area overlapping the active layer in the third sub-pixel.

16. The display device of claim 15, wherein the transistor in each of the plurality of sub-pixels further includes a source electrode connected to the corresponding light emitting element, and
wherein the first capacitor electrode in the third sub-pixel is electrically connected to the source electrode in the third sub-pixel.

17. The display device of claim 15, wherein a distance between the second capacitor electrode and the active layer in each of the first and second sub-pixels is smaller than a distance between the first capacitor electrode in the third sub-pixel and the active layer in the third sub-pixel.

18. A display device, comprising:
a substrate including a display area having a plurality of sub-pixels and a non-display area surrounding the display area;
a storage capacitor disposed in each of the plurality of sub-pixels;
a buffer layer disposed on the storage capacitor in each of the plurality of sub-pixels;
a transistor in each of the plurality of sub-pixels being disposed on the buffer layer;
a light emitting element disposed on the corresponding transistor in each of the plurality of sub-pixels, and
a metal layer disposed below the transistor and in each of the plurality of sub-pixels,
wherein the plurality of sub-pixels include a first sub-pixel, a second sub-pixel, and a third sub-pixel, each of the first, second and third sub-pixels being configured to emit a different color of light, and
wherein the metal layer in the third sub-pixel is disposed on a different layer than the metal layers in the first and second sub-pixels.

19. A display device, comprising:
a first sub-pixel, a second sub-pixel and a third sub-pixel disposed on a substrate, each of the first, second and third sub-pixels being configured to emit a different color of light;
a first storage capacitor, a second storage capacitor and a third storage capacitor disposed in the first, second and third sub-pixels, respectively;
a first transistor, a second transistor and a third transistor disposed in the first, second and third sub-pixels, respectively; and
a first metal layer, a second metal layer and a third metal layer disposed below the first, second and third transistors and in the first, second and third sub-pixels, respectively,
wherein the first, second and third transistors are a driving transistor for driving the first, second and third sub-pixels, respectively,
wherein the first sub-pixel is a red sub-pixel, the second sub-pixel is a green sub-pixel, and the third sub-pixel is a blue sub-pixel, and
wherein the third transistor of the third sub-pixel has a lower S-factor than that of the first transistor of the first sub-pixel and the second transistor of the second sub-pixel.

* * * * *